United States Patent
Retz et al.

(10) Patent No.: US 6,842,071 B1
(45) Date of Patent: Jan. 11, 2005

(54) VARIABLE GAIN AMPLIFIER

(75) Inventors: Guido Retz, Ardmore (IE); David Philip Burton, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 20 days.

(21) Appl. No.: 10/600,986

(22) Filed: Jun. 20, 2003

Related U.S. Application Data

(60) Provisional application No. 60/390,379, filed on Jun. 21, 2002.

(51) Int. Cl.[7] .............................. H03G 5/16; H03G 3/10; H03F 3/04
(52) U.S. Cl. ......................... 330/133; 330/279; 330/310
(58) Field of Search ................................ 330/133, 279, 330/310, 134

(56) References Cited

U.S. PATENT DOCUMENTS

| | | | | |
|---|---|---|---|---|
| 4,628,276 A | * | 12/1986 | Mizutani | 330/86 |
| 5,216,384 A | * | 6/1993 | Vanhecke | 330/279 |
| 5,880,631 A | * | 3/1999 | Sahota | 330/51 |
| 6,094,099 A | * | 7/2000 | Kobayashi | 330/254 |
| 6,218,899 B1 | | 4/2001 | Ezell | |
| 6,445,248 B1 | * | 9/2002 | Gilbert | 330/51 |
| 6,734,730 B2 | * | 5/2004 | Doi et al. | 330/133 |

OTHER PUBLICATIONS

"MAX3524, Low–Noise, High–Linearity Broadband Amplifier", Maxim Integrated Products, 7/00, pp. 1–7.
"A CATV Attenuator Using the Single Package SMP1307–027 PIN Diode Array", Alpha Industries, Inc., 11/99, pp. 1–10.

(List continued on next page.)

Primary Examiner—Patricia Nguyen
(74) Attorney, Agent, or Firm—Wolf, Greenfield & Sacks P.C.

(57) ABSTRACT

A differential variable gain amplifier (1) comprises eight identical variable gain stages (8a to 8d) which are arranged in two groups, namely, a high gain group (19) and a low gain group (20). The first gain stage (8a) is coupled directly to a pair of positive and negative main input terminals (4,5) for receiving a differential input signal to be amplified. A pair of voltage divider impedance chains (14) comprising identical capacitors (C1a to C1g) define taps (17b to 17h) through which the input signal is applied to the corresponding gain stages (8b to 8h) in progressive steps of attenuation. Each gain stage (8) comprises a pair of identical variable gain amplifier elements (11) which amplify the respective positive and negative ends of the differential input signal. Only one of the gain stages (8a to 8h) is selected at any one time by a control circuit 10. The outputs from the gain stages (8) of the high gain group (19) are applied to positive and negative high gain output terminals (28,29). The output of the gain stages (8) of the low gain group (20) are applied on positive and negative low gain output terminals (33,34). A pair of selectively activatable shunt-shunt feedback circuits (42a,42b) each comprising a variable gain feedback amplifier (43a,43b) provide variable shunt impedance at the main input terminals (4,5) for maintaining the input impedance of the variable gain amplifier (1) within a predetermined input impedance range as the gain of the variable gain amplifier (1) is varied, and when the variable gain amplifier (1) is operating at the high end of its gain range. A passive shunt impedance circuit (40) comprising a plurality of resistive shunt impedance elements are independently selectively shuntable across the main input terminals (4,5) for maintaining the input impedance of the variable gain amplifier (1) within the predetermined input impedance range when the variable gain amplifier (1) is operating at the low gain end of its gain range.

46 Claims, 6 Drawing Sheets

OTHER PUBLICATIONS

Kaunisto, Risto, et al, "A Linear–Control Wide–Band CMOS Attenuator", Helsinki University of Technology, 9/01, pp. IV–458–461.

Meyer, Robert G. et al, "A DC to 1–GHz Differential Monolithic Variable–Gain Amplifier", IEEE Journal of Solid–State Circuits, vol. 26, No. 11, 11/91, pp. 1673–1680.

Otaka, Shoji et al, "A Low–Power Low–Noise Accurate Linear–in–dB Variable–Gain Amplifier with 500–MHz Bandwidth", IEEE Journal of Solid–State Circuits, vol. 35, No. 12, Dec. 2000, pp. 1942–1948.

Yamaji, Takafumi et al, "A Temperature–Stable CMOS Variable–Gain Amplifier with 80–dB Linearly Controlled Gain Range", IEEE Journal of Solid–State Circuits, vol. 37, No. 5, May 2000, pp. 553–558.

Connell, Larry et al, "A CMOS Broadband Tuner IC", Motorola, Inc., ISSCC 2002, pp. 324–325, 529.

"AD8367, 500 MHz, Linear–in–dB VGA with AGC Detector", Analog Devices, Inc., 2001, pp. 1–16.

* cited by examiner

VARIABLE GAIN AMPLIFIER

CROSS-REFERENCE TO RELATED APPLICATIONS

This application claims the benefit, under 35 U.S.C. §119(e), of U.S. Provisional Application Ser. No. 60/390,379, filed Jun. 21, 2002, entitled "Highly Linear Digitally Controlled Variable-Gain Low Noise Amplifier," which application is hereby incorporated herein by reference.

FIELD OF THE INVENTION

The present invention relates to a variable gain amplifier, and in particular to a broadband radio frequency variable gain amplifier, which is suitable for use in the processing of, for example, cable and terrestrial digital television signals.

BACKGROUND TO THE INVENTION

With the expansion of digital television, signal processing equipment which can process digital television signals transmitted over cable and over terrestrial channels is required. The provision of a single chip receiver capable of processing both types of digital television signals is desirable. Furthermore, the implementation of such a single chip receiver in CMOS technology is desirable due to the repeatability and cost advantage which can be achieved using CMOS processes. However, so far such a fully integrated single chip receiver has not yet been successfully provided. One of the difficulties in providing such a single chip integrated receiver lies in the requirement of providing a suitable variable gain amplifier, and in particular, a variable gain amplifier with low noise characteristics in CMOS which is suitable for terrestrial digital television signals.

Various designs of variable gain amplifiers with low noise characteristics are known. The classic approach used in cable tuner designs is the application of a PIN-diode attenuator in front of a fixed gain low noise amplifier. Such an amplifier is disclosed by Maxim Integrated Products Inc. in their data sheet "MAX 3524-low-noise high linearity broad band amplifier", Revision 0, 2000, and by Alpha Industries Inc. in a publication entitled "A CATV attenuator using the single package SMP1307-027 PIN-diode array", application note APN 1017 http:\\www.alphaind.com. While such circuits provide good performance characteristics, they are not readily integratable, and have a high power requirement.

U.S. Pat. No. 6,218,899 of Ezell discloses another form of variable gain amplifier in which the gain of a common source device is varied by means of both the source degeneration and load resistance. When the source degeneration resistance is increased, the feedback factor increases and causes linearity to improve. However, the variation range of the source degeneration resistance, and hence linearity improvement is limited by headroom constraints, particularly in a low voltage environment. In order to meet peak two-one third order intercept point (IIP3) requirements, a high initial linearity is required, which results in a high power consumption.

Kaunisto, et al in an article entitled "Linear control wide band CMOS attenuator", The 2001 Symposium on Circuits and Systems, 2001, ISCAS 2001, Volume 4, 2001 discloses a variable attenuator suitable for constructing a variable gain amplifier. In the device of Kaunisto, et al, a Pi- or T-type attenuator may be implemented with MOSFETs similar to the technology used in variable attenuators implemented in GaAs. A recent example implemented in a 0.8 μm CMOS process exhibits a minimum insertion loss of 3.3 dB and a peak IIP3 of only 15 dBm. However, such performance is insufficient for cable and terrestrial digital television applications.

Classic bipolar or MOSFET variable-gain amplifier circuits which attenuate the signal at the output of a transconductance stage in the current domain are disclosed in papers entitled "A DC to 1-GHz differential monolithic variable-gain amplifier", by Meyer et al, IEEE JSSC, Volume 26, No. 11, November 1991, and "A low-power low-noise accurate linear-in-dB variable-gain amplifier with 500-MHz bandwidth" by Otaka et al, IEEE JSSC, Volume 35, No. 12, December 2000. With these circuits a large attenuation range and an accurate gain control characteristic can be achieved. However, a problem with these circuits arises from the fact that the signal passes the transconductance stage without any prior attenuation, and therefore the overall linearity is ultimately limited by the linearity of the transconductance stage. CMOS implementations of these circuits is disclosed in an article entitled "A temperature-stable CMOS variable-gain amplifier with 80 dB linearly controlled gain range" by Yamaji et al, IEEE JSSC, Volume 37, No. 5, May 2002. Targeted at different applications, these implementations do not meet the performance requirements for a broadband radio frequency receiver. In the article entitled "A CMOS broadband tuner IC", Connell discloses an approach which bears similarities to the classic output current steering attenuation scheme which has been used for a variable gain amplifier. Despite good linearity properties, the gain range and the peak IIP3 of the circuit remains below the target requirements for terrestrial DTV reception.

A variable gain amplifier is disclosed in a data sheet entitled "AD8367 500 MHz, linear-in-dB VGA with AGC detector" of Analog Devices, Inc., Revision 0, 2001. In this variable gain amplifier a multitude of transconductance stages are connected to a resistive ladder divider The gain of the amplifier is controlled by some form of control circuitry. Apart from a large attenuation range, the main advantage of the resistive ladder variable-gain amplifier is the attenuation of the signal in a highly linear passive structure before it is processed in a transconductance stage. In this way the IIP3 increases with increasing attenuation. CMOS implementations of the architecture with discrete interpolation circuits have been suggested. The main disadvantage of the architecture is the additional noise contributed by the resistive ladder at the input of the amplifier. A commercial 45 dB gain range 500 MHz variable-gain amplifier exhibits a minimum noise figure of 7.5 dB referred to a source impedance of 200D. Although further improvements seem possible, the noise figure levels required for terrestrial reception are unlikely to be achievable. If MOSFETs are used, the large input capacitance of MOSFETs makes it difficult tQ achieve a flat frequency response over the wide input frequency range.

Accordingly, none of the above variable gain amplifiers are ideally suited for amplifying terrestrial digital television signals, in that they all suffer from one shortcoming or another.

There is therefore a need for a variable gain amplifier which is suitable for amplifying both cable and terrestrial digital television signals and which is suitable for implementing in a CMOS process. Indeed, there is also a need for a variable gain amplifier which is suitable for implementing in a CMOS process which is suitable for amplifying signals over a relatively broad band of frequencies.

The present invention is directed towards providing such a variable gain amplifier.

SUMMARY OF THE INVENTION

According to the invention there is provided a variable gain amplifier comprising:

- a main input terminal for receiving an input signal to be amplified,
- a main output terminal for outputting the amplified signal,
- N selectively selectable gain stages, where N is an integer greater than one, for amplifying the input signal, the gain stages having respective signal outputs for providing the amplified input signal to the main output terminal, a first of the N gain stages being coupled to the main input terminal,
- a voltage divider impedance chain, a first end of which is coupled to the main input terminal the voltage divider impedance chain having (N-1) output taps coupled to respective ones of the gain stages from a second one to an Nth one of the N gain stages for applying the input signal to the gain stages from the second to Nth gain stage progressively attenuated from the second gain stage to the Nth gain stage,
- a selectively operable shunt-shunt feedback circuit for feeding back the amplified input signal from at least one of the gain stages to the main put terminal for varying the input impedance of the variable gain amplifier,
- at least one passive shunt impedance element selectively switchable to the main input terminal for varying the input impedance of the variable gain amplifier, and
- a control circuit for selecting the feedback circuit and the at least one passive shunt impedance element in response to the selected gain stage for maintaining the input impedance of the variable gain amplifier within a predetermined input impedance range.

In one embodiment of the invention the feedback circuit is arranged for feeding back the amplified input signal from the first one of the N gain stages to the main input terminal.

In another embodiment of the invention the feedback circuit feeds back the amplified input signal to the main input terminal independently of the signal on the main output terminal.

In another embodiment of the invention the signal outputs of the gain stages are coupled to the main output terminal, and the feedback circuit is operably coupled between the main output terminal and the main input terminal.

In one embodiment of the invention the feedback circuit and the at least one passive shunt impedance element are alternately selectable by the control circuit, or alternatively, the feedback circuit and the at least one passive shunt impedance element are simultaneously selectable by the control circuit.

In another embodiment of the invention the at least one passive shunt impedance element is selected by the control circuit when the shunt impedance value applied to the main input terminal by the feedback circuit is insufficient for maintaining the input impedance of the variable gain amplifier within the predetermined input impedance range.

Preferably, a plurality of passive shunt impedance elements are provided, the passive shunt impedance elements being selectively selectable by the control circuit in response to the selected gain stage. The impedance values of the respective passive shunt impedance elements are the same or different. Preferably, each passive shunt impedance element comprises a passive resistive element.

Preferably, the shunt impedance value applied to the main input terminal by the feedback circuit is selectively variable under the control of the control circuit in response to the selected gain stage.

In one embodiment of the invention the feedback circuit comprises an input terminal coupled to the main output terminal, an output terminal coupled to the main input terminal, and a transconductance device for feeding a current to the main input terminal through the output terminal.

Preferably, the bias current of the transconductance device of the feedback circuit is variable under the control of the control circuit in response to the selected gain stage.

In one embodiment of the invention the feedback circuit comprises a control terminal for receiving a control signal from the control circuit for setting the bias current of the transconductance device. Advantageously, the value of the control signal for controlling the bias current of the transconductance device is selectable by the control circuit in response to the selected gain stage.

In one embodiment of the invention the output of the feedback circuit is fed back to the inverting input of an operational amplifier, a control voltage being applied to the non-inverting input of the operational amplifier, and an output of the operational amplifier is coupled to the transconductance device for controlling the bias voltage of the transconductance device so that the output voltage on the output terminal of the feedback circuit is driven to the value of the control voltage applied to the non-inverting input of the operational amplifier.

In another embodiment of the invention the input terminal to the feedback circuit is AC coupled to the main output terminal.

In a further embodiment of the invention each gain stage comprises an amplifier element comprising a transconductance device to which the input signal is amplified. Preferably, the gain of the amplifier element of at least some of the gain stages is variable under the control of the control circuit.

In one embodiment of the invention the feedback circuit and the at least one passive shunt impedance element are selected by the control circuit in response to the selected gain of the amplifier element of the selected gain stage.

In another embodiment of the invention the value of the control signal for controlling the bias current of the transconductance device of the feedback circuit is selected in response to the selected gain of the amplifier element of the selected gain stage.

Preferably, the voltage divider impedance chain is a capacitive voltage divider comprising a plurality of capacitive elements defining the output taps therebetween, and advantageously, the capacitance of the capacitive elements between the output taps of the voltage divider impedance chain are selected to take account of the parasitic capacitance of the transconductance devices of the respective amplifier elements of the gain stages for determining the attenuation of the input signal at the respective output taps. Ideally, the capacitance of the capacitive elements of the voltage divider impedance chain are selected to take account of the parasitic capacitance of the transconductance devices of the respective amplifier elements of the gain stages when the transconductance devices thereof are biased with a voltage of value such that the voltage dependency of the parasitic capacitance of the transconductance devices is minimised when the gain stage comprising those transconductance devices are not selected.

In one embodiment of the invention the capacitance of the capacitive elements of the voltage divider impedance chain are selected for linearising the attenuation on a logarithmic scale of the input signal presented sequentially on the output taps from the first output tap to the (N-1) output tap.

Preferably, the impedance value between each pair of adjacent output taps of the voltage divider impedance chain is selected so that the attenuating effect of the voltage divider impedance chain between each pair of adjacent output taps does not exceed the range over which the gain of the preceding gain stage may be varied.

Advantageously, the impedance value between each pair of adjacent output taps of the voltage divider impedance chain is selected so that the attenuating effect of the voltage divider impedance chain between each pair of adjacent output taps is substantially similar to the range over which the gain of the preceding gain stage may be varied.

In one embodiment of the invention a second end of the voltage divider impedance chain is coupled to a reference ground.

In one embodiment of the invention each amplifier element comprises a first bias voltage terminal for receiving a first bias voltage for applying to the transconductance device thereof for minimising the voltage dependency of the parasitic capacitance of the transconductance device when the gain stage comprising that amplifier element is not selected.

In another embodiment of the invention the first bias voltage terminal is selectively switchable to the transconductance device under the control of the control circuit, and preferably, the first bias voltage terminal of each amplifier element is coupled to the transconductance device thereof through a first impedance circuit. Preferably, the impedance of the first impedance circuit of each amplifier element is greater than the source impedance presented to the amplifier element so that the influence of the first bias voltage on the frequency characteristic of the voltage divider impedance chain remains substantially negligible when the gain stage comprising that amplifier element is not selected.

In one embodiment of the invention each amplifier element comprises a second bias voltage terminal for receiving and applying a second bias voltage to the transconductance device thereof for biasing the transconductance device of the amplifier element when the gain stage comprising the amplifier element is selected. Preferably, the second bias voltage terminal of each amplifier element is selectively switchable to the transconductance device thereof under the control of the control circuit. Advantageously, the second bias voltage terminal of each amplifier element is coupled to the transconductance device thereof through a second impedance circuit, the impedance of the second impedance circuit being greater than the source impedance presented to the amplifier element so that the influence of the second bias voltage on the frequency characteristic of each amplifier element remains substantially negligible when the gain stage comprising that amplifier element is selected.

In one embodiment of the invention only one gain stage is selectable at one time, and the gain stages are the same or different.

In one embodiment of the invention the N gain stages are arranged in M groups, where M is an integer from 2 upwards, and M main output terminals are provided, the outputs of the gain stages of the respective groups being coupled to corresponding ones of the M main output terminals, with the outputs of the gain stages of a first group of the M groups of gain stages being coupled to a first one of the M main output terminals, and the outputs of the gain stages of an Mth group of the M groups of gain stages being coupled to an Mth one of the M main output terminals. Preferably, the feedback circuit is operably coupled between the main input terminal and one of the M main output terminals.

In another embodiment of the invention the first group of the M groups of gain stages provides the greatest gain.

Preferably, the feedback circuit is coupled to the first main output terminal of the M main output terminals.

In one embodiment of the invention a plurality of feedback circuits are provided corresponding to respective ones of at least some of the M main output terminals for feeding back the output signals on the corresponding ones of the at least some of the M main output terminals to the main input terminal.

In a further embodiment of the invention a shunt peak output load element is coupled to each main output terminal for enhancing the bandwidth of the variable gain amplifier and minimising power consumption.

In one embodiment of the invention the variable gain amplifier is a differential variable gain amplifier comprising a pair of main input terminals for receiving respective positive and negative ends of a differential input signal, a pair of main output terminals for outputting respective positive and negative ends of the amplified differential output signal, each gain stage comprising a pair of amplifier elements for amplifying the corresponding ones of the positive and negative ends of the differential input signal, and for outputting the amplified positive and negative signals on the respective corresponding main output terminals, and a pair of voltage divider impedance chains coupled to the respective main input terminals for applying the positive and negative ends of the differential input signal to the corresponding amplifier elements of the second to the Nth gain stage.

Additionally, the invention provides a variable gain amplifier comprising:

a main input terminal for receiving an input signal to be amplified, a main output terminal for outputting the amplified signal, N selectively selectable gain stages, where N is an integer greater than one, each gain stage comprising:

an amplifier element comprising a transconductance device for amplifying the input signal, a signal output for providing the amplified signal to the main output terminal, and a signal input, the signal input of the amplifier element of a first of the N gain stages being coupled to the main input terminal, a first bias voltage terminal being provided to each amplifier element for receiving a first bias voltage for applying to the transconductance device, the first bias voltage being of value for minimising the voltage dependency of the parasitic capacitance of the transconductance device when the corresponding gain stage is not selected, a voltage divider impedance chain, a first end of which is coupled to the main input terminal, the voltage divider impedance chain having (N-1) output taps coupled to the signal inputs of the amplifier elements of the respective ones of the gain stages from a second one to an Nth one of the N gain stages for applying the input signal to the amplifier elements of the gain stages from the second to the Nth gain stage progressively attenuated from the second gain stage to the Nth gain stage.

The invention also provides a variable gain amplifier comprising:

a main input terminal for receiving an input signal to be amplified, a main output terminal for outputting the amplified signal, an amplifier element of selectable gain having a signal input for receiving an input signal from the main input terminal, and a signal output for providing the amplified input signal to the main output terminal, a selectively operable shunt-shunt feedback circuit for feeding back the amplified input signal from the amplifier element to the main input terminal for varying the input impedance of the variable gain amplifier, at least one passive shunt impedance element selectively switchable to the main input terminal for varying the input impedance of the variable gain amplifier, and a control circuit for selecting the feedback circuit and the at least one passive shunt impedance element in response to the selected gain of the amplifier element for maintaining the input impedance of the variable gain amplifier within a predetermined input impedance range.

ADVANTAGES OF THE INVENTION

The advantages of the invention are many. In particular, the provision of the shunt-shunt feedback circuit and the passive shunt impedance circuit provide particularly good impedance matching for matching the impedance of the variable gain amplifier with the source impedance. By providing the shunt-shunt feedback circuit and the passive shunt impedance circuit, the input impedance of the variable gain amplifier can be maintained within a relatively narrow predetermined input impedance range as the gain of the variable gain amplifier is varied. In particular, the shunt-shunt feedback circuit can provide sufficient shunt impedance at the main input terminal for maintaining the input impedance of the variable gain amplifier within the predetermined input impedance range while the gain of the variable gain amplifier is being varied at the high gain end of the gain range. As the gain of the variable gain amplifier is then further reduced, shunt impedance can be shunted to the main input terminal from the passive shunt impedance circuit for maintaining the input impedance of the variable gain amplifier within the predetermined input impedance range for the lower end of the gain range of the amplifier.

The feedback amplifier of the shunt-shunt feedback circuit provides relatively good noise performance, which is significantly better than the noise performance which can be achieved from the passive shunt impedance circuit. However, distortion of the signal is stronger when the feedback amplifier of the shunt-shunt feedback circuit is active. The passive shunt impedance circuit causes significantly less distortion than the feedback amplifier, due to the fact that the shunt impedance elements of the passive shunt impedance circuit are passive elements, namely, resistive elements. However, since the shunt-shunt feedback circuit is activated when the variable gain amplifier is operating at the high end of the gain range only, the level of the input signal would generally be relatively low, and thus distortion of the signal is not particularly critical, and is not as critical as when the level of the input signal is higher, for example, when the variable gain amplifier is operating at the lower end of the gain range. Additionally, the fact that the feedback amplifier provides good noise performance is also particularly important when the signal is a relatively low level signal. However, when the variable gain amplifier is operating at the low end of the gain range, the input signal, in general, is at a relatively higher level where minimum distortion is required, and noise performance is not as important. Thus, since at the low end of the gain range of the variable gain amplifier, the shunt-shunt feedback circuit will be deactivated, and the additional shunt impedance will be obtained from the passive shunt impedance circuit, which causes little distortion, and additionally, once the gain of the variable gain amplifier is operating in the low end of the gain range, its input referred noise is more and more dominated by the actual signal attenuation than by the intrinsic noise of the amplifier itself. Thus, any additional thermal noise at the input of the variable gain amplifier resulting from the passive shunt impedance circuit becomes insignificant. Accordingly, the frequency range over which the variable gain amplifier according to the invention is operable is maximised.

A further advantage of the invention is achieved when the feedback amplifier of the shunt-shunt feedback circuit is a variable gain amplifier. This permits the shunt impedance provided by the shunt-shunt feedback circuit to be varied as the gain of the variable gain amplifier is being varied. Therefore the shunt impedance provided by the shunt-shunt feedback circuit can more accurately track the variation in the input impedance of the variable gain amplifier as the gain thereof is varied.

By providing the shunt-shunt feedback circuit with a feedback amplifier having a transconductance device, and by arranging for the bias current through the transconductance device to be varied, particularly fine adjustment of the effective impedance shunted to the main input terminal by the shunt-shunt feedback circuit is achieved.

The advantage of applying the second bias voltage the transconductance device of each amplifier element when the amplifier element is selected through a second impedance circuit, which is of impedance greater, and preferably, significantly greater than the source impedance presented to the amplifier element is that the bias voltage path of the second bias voltage has little or no influence on the frequency characteristic of the selected amplifier element.

A further advantage of the invention is achieved by biasing the transconductance device of each amplifier element when the amplifier element is deselected with the first bias voltage such that the value of the first bias voltage is such as to minimise the voltage dependency of the parasitic capacitance of the transconductance device. By minimising the voltage dependency of the parasitic capacitance of the transconductance devices of the deselected gain stages, the distortion performance of the variable gain amplifier is improved. In other words, distortion of the amplified input signal is minimised. The parasitic capacitance of the transconductance devices of the amplifier elements has an effect on the impedance of the voltage divider impedance chain even when the gain stages comprising those amplifier elements are deselected. Thus, by minimising the voltage dependency of the parasitic capacitance of the transconductance devices of the amplifier elements while their gain stages are deselected, variation in the impedance between the corresponding pairs of adjacent output taps of the voltage divider impedance chain is also minimised, thereby minimising the distortion of the signal in the voltage divider impedance chain. Furthermore, since the value of the deselected parasitic capacitance of the gain stages is known, the impedance of the voltage divider impedance chain can be selected in order to take account of the parasitic capacitance of the gain stages, so that the attenuation of the input signal at the respective output taps is at the desired level. When the voltage divider impedance chain is a capacitive impedance chain, the capacitance of the capacitive elements between adjacent output taps can be selected to take account of the parasitic capacitance of the transconductance of the gain stages. Accordingly, by minimising the voltage dependency of the parasitic capacitance of the transconductance devices of the gain stages which are deselected, the dependency of the attenuation characteristics of the voltage divider impedance chain on whether a gain stage is selected or deselected is reduced.

By applying the first bias voltage to the transconductance device of each amplifier element, when the amplifier element is deselected, through a first impedance circuit of greater, and preferably, significantly greater impedance than the source impedance presented to the amplifier element, the bias voltage path of the first bias voltage has little or no influence on the frequency characteristic of the voltage divider impedance chain, when the gain stage comprising that amplifier element is deselected.

Arranging the N gain stages in M groups of gain stages provides the advantage that the parasitic capacitance at the main output terminal of each group is reduced, thereby reducing power consumption of the variable gain amplifier.

The advantage of providing an output load impedance in the form of an inductor and resistor is that the load inductor and the load resistor form a shunt peaked load which extends the bandwidth over which the variable gain amplifier is operable, and furthermore, reduces the power consumption of the variable gain amplifier.

The invention and the advantages thereof will be more clearly understood from the following description of a preferred non-limiting embodiment thereof, which is described with reference to the accompanying drawings.

DETAILED DESCRIPTION OF A PREFERRED EMBODIMENT OF THE INVENTION

Figure 1:
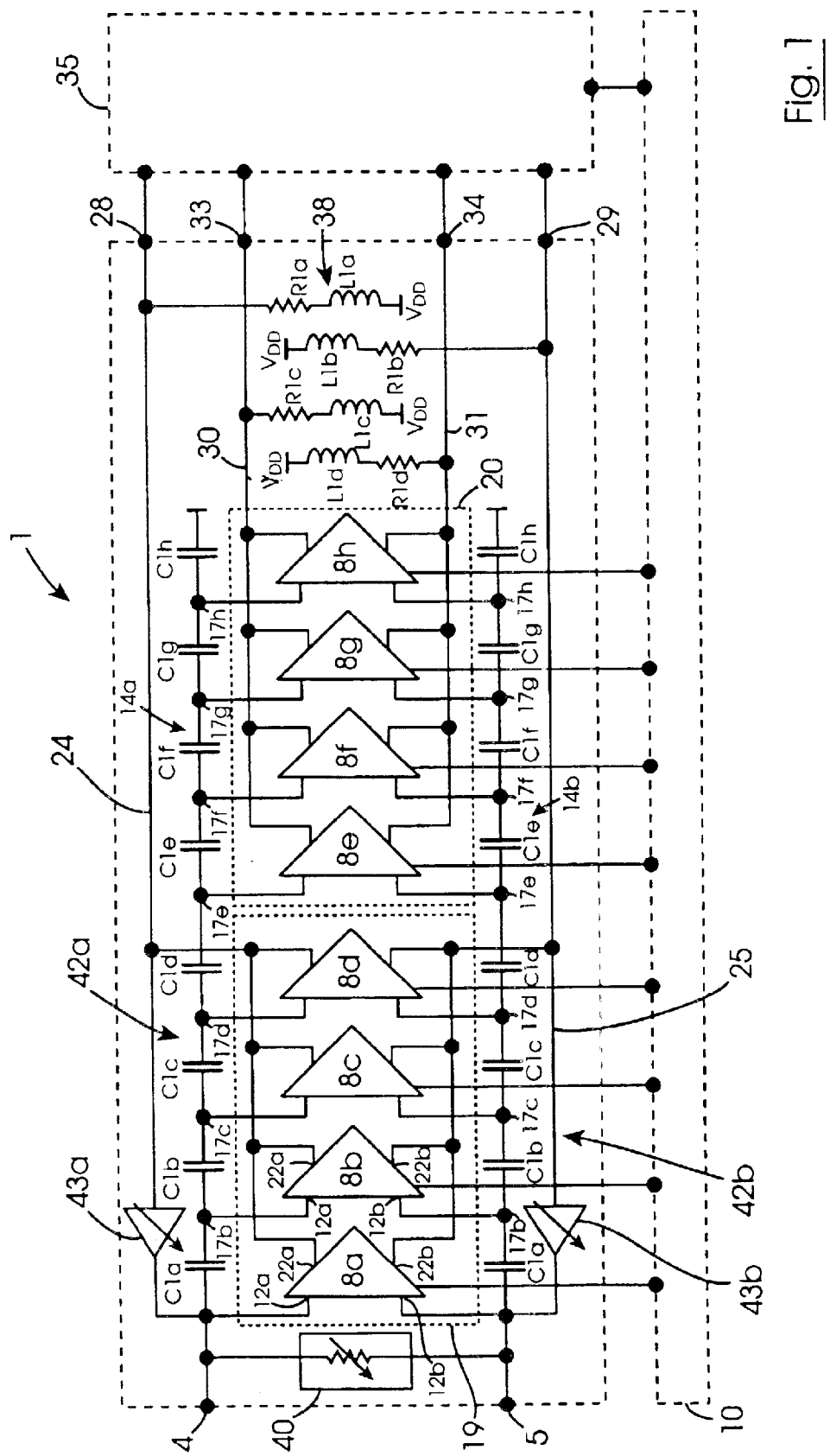
FIG. 1 is a block representation of a variable gain amplifier according to the invention.

Referring to the drawings and initially to FIG. 1, there is illustrated a broadband radio frequency differential variable gain multi-stage amplifier according to the invention, indicated generally by the reference numeral 1. The variable gain amplifier 1 is an amplifier with low noise characteristics, and is particularly suitable for amplifying digital television signals from an antenna and/or a communal cable system. Prior to being applied to the variable gain amplifier 1, the signals from the antenna and/or cable system are filtered by a band selection filter (not shown) and are converted into a differential form in order to maintain symmetry to ground.

The variable gain amplifier 1 comprises a pair of differential input terminals, namely, a positive main input terminal 4, and a negative main input terminal 5 for receiving the respective positive and negative ends of the differential signal from the band selection filter (not shown). N identical gain stages, in this embodiment of the invention eight gain stages 8a to 8h are provided in the variable gain amplifier 1 for amplifying the differential input signals, the gain stage 8a being the first gain stage and the gain stage 8h being the Nth, namely, the eighth gain stage. The gain stages 8 are individually selectable under the control of a digital control circuit 10, so that only one gain stage 8 is selected at one time.

Figure 2:
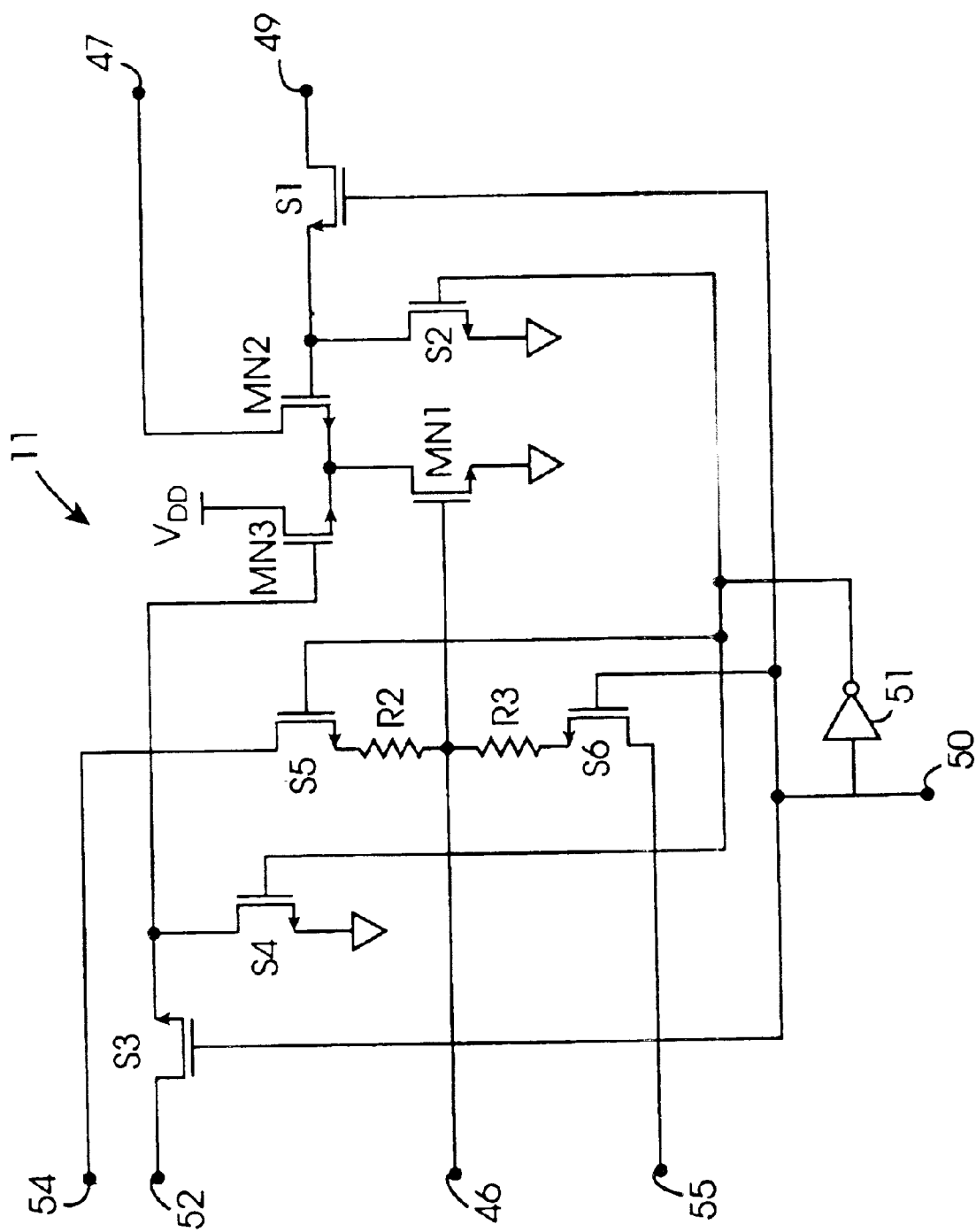
FIG. 2 is a circuit diagram of a portion of the amplifier of FIG. 1.

Each gain stage comprises a pair of identical variable gain amplifier elements 11 for receiving corresponding ones of the positive and negative ends of the input signal: One of the is amplifier elements 11 is illustrated in FIG. 2 and will be described in detail below. The gain of each amplifier element 11 is selectable under the control of the control circuit 10, as will be described below.

Each gain stage 8 comprises a pair of signal inputs, namely, a positive signal input 12a, and a negative signal input 12b, for receiving the positive and negative ends of the input signal from the positive and negative main input terminals 4 and 5, respectively, for in turn applying the respective positive and negative ends of the input signal to the corresponding amplifier elements 11. The positive and negative signal inputs 12a and 12b of the first gain stage 8a are coupled directly to the positive main input terminal 4 and the negative main input terminal 5, respectively.

A pair of voltage divider impedance chains 14a and 14b are provided to form respective capacitive attenuation ladders for applying the positive and negative ends of the input signal on the positive and negative main input terminals 4 and 5, respectively, to the gain stages 8 from the second gain stage 8b to the eighth gain stage 8h. One end, namely, first ends of the respective voltage divider impedance chains 14a and 14b are coupled to the positive main input terminal 4 and the negative main input terminal 5, respectively, and the other end; namely, second ends of the respective voltage divider impedance chains 14a and 14b are coupled to ground.

Each voltage divider impedance chain 14 comprises (N-1) impedance elements, namely, seven capacitors C1a to C1g. The capacitors C1a to C1g of the two chains 14a and 14b are identical to each other and are of identical capacitance. Capacitors C1h of the two chains 14a and 14b, which are of identical capacitance, but are of capacitance different to the capacitance of the capacitors C1a to C1g couple the chains to ground. The selection of the capacitance value of the capacitors C1a to C1g is described below. Each voltage divider impedance chain 14a and 14b defines (N-1) output taps, namely, seven output taps 17b to 17h to which the corresponding signal inputs 12a and 12b of the gain stages 8b to 8h, respectively, are coupled. The signal inputs 12a and 12b of the second gain stage 8b are coupled to the corresponding taps 17b of the voltage divider impedance chains 14a and 14b, respectively. The signal inputs 12a and 12b of the third gain stage 8c are coupled to the corresponding taps 17c, and so on up to the signal inputs 12a and 12b of the eighth gain stage 8h which are coupled to the corresponding taps 17h. Accordingly, the positive and negative ends of the input signal applied to the gain stages 8 are attenuated in equal steps on a logarithmic scale from the first gain stage 8a to the eighth gain stage 8h.

The eight gain stages 8a to 8h are arranged in M groups, in this embodiment of the invention two groups, namely, a first group 19 and a second group 20, and each group 19 and 20 comprises four gain stages 8. The first group 19 comprises the gain stages 8a to 8d, and is thus a high gain group. The second group 20 comprises the gain stages 8e to 8h, and is thus a low gain group.

Each gain stage 8 comprises two signal outputs, namely, a positive signal output 22a and a negative signal output 22b, on which the respective positive and negative ends of the amplified signals from the respective amplifier elements 11 are outputted. The amplified signal from the positive signal input 12a is outputted on the positive signal output 22a of each gain stage 8, and the amplified signal from the negative signal input 12b is outputted on the negative signal output 22b. The positive signal outputs 22a of the first to the fourth gain stages 8a to 8d of the first group 19 are coupled to a positive high gain main output terminal 28 by a positive high gain output line 24, while the negative signal outputs 22b of the first to the fourth gain stages 8a to 8d are coupled to a negative high gain main output terminal 29 by a negative high gain output line 25. The positive and negative signal outputs 22a and 22b of the fifth to the eighth gain stages 8e to 8h of the second group 20 are coupled to positive and negative low gain main output terminals 33 and 34, respectively, by positive and negative low gain output lines 30 and 31, respectively. The positive and negative high gain and low gain main output terminals 28 and 29, and 33 and 34 form respective pairs of differential output terminals of the variable gain amplifier 1.

The positive and negative high gain main output terminals 28 and 29, and the positive and negative low gain main output terminals 33 and 34 are coupled to corresponding separate inputs of a frequency converter 35, which processes the amplified signals from the appropriate pair of differential output terminals, in response to appropriate control signals from the control circuit 10. Since the frequency converter 35 does not form part of the invention, it will not be described in further detail, however, such frequency converters and their use will be readily apparent to those skilled in the art.

Identical output load impedance circuits 38 couple each of the positive and negative high gain and low gain output lines 24 and 25, and 30 and 31 to the supply voltage $V_{DD}$ of the variable gain amplifier 1, and form respective shunt peaked loads which maximises the bandwidth over which the variable gain amplifier 1 is operable, and thereby assist in reducing the power consumption of the variable gain amplifier 1. Each output load impedance circuit 38 comprises a load resistor R1 and an inductor L1. The load resistor R1 and the load inductor L1 which couple the positive high gain output line 24 to the supply voltage $V_{DD}$ are identified as resistor R1a and inductor L1a, while the load resistor and load inductor coupling the negative high gain output line 25 to the supply voltage $V_{DD}$ are identified as R1b and L1b. The load resistor and the load inductor of the output load impedance circuit 38 which couples the positive low gain output line 30 to the supply voltage $V_{DD}$ are identified as the resistor R1c and L1c, while the load resistor and load inductor of the output load impedance circuit 38 which couple the negative low gain output line 31 to the supply voltage $V_{DD}$ are identified as R1d and L1d.

Figure 3:
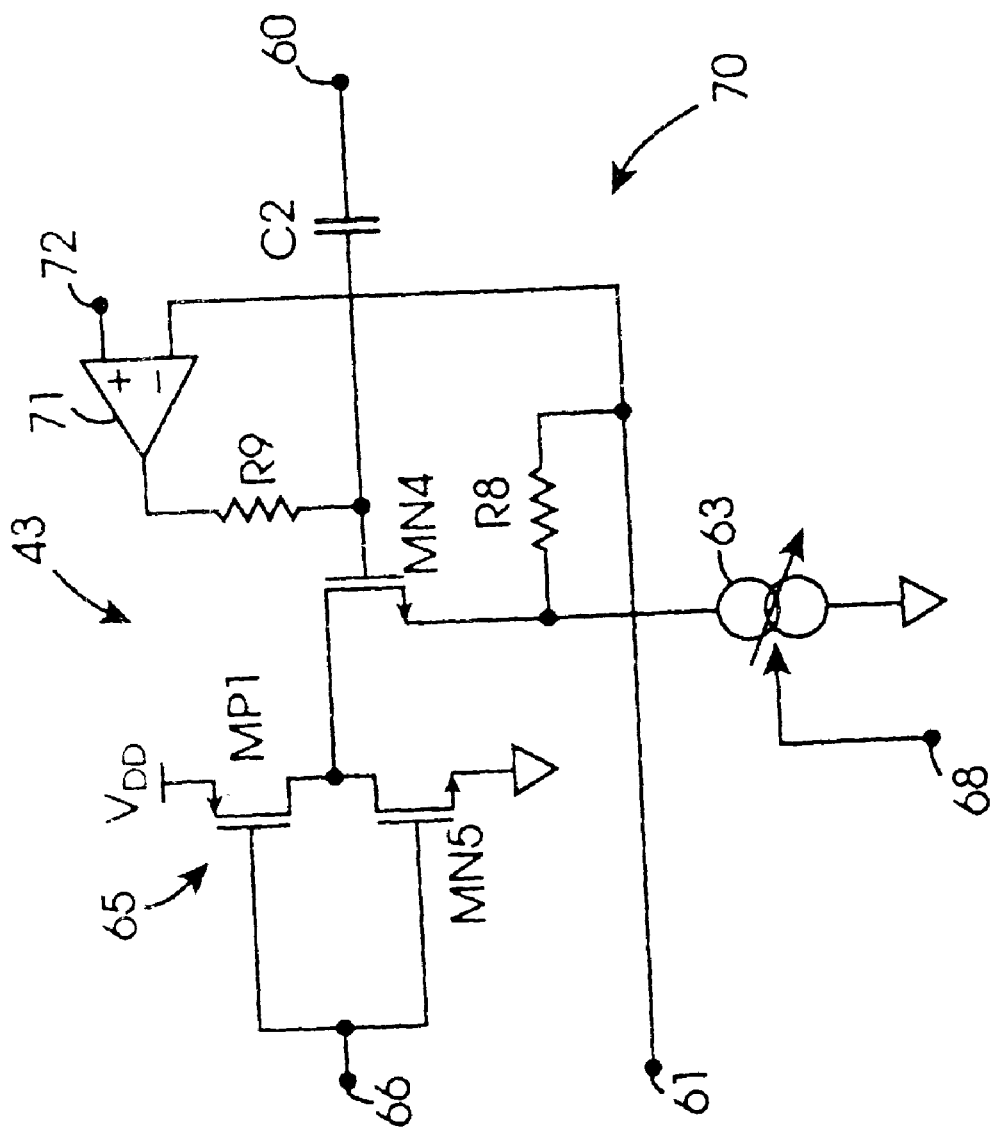
FIG. 3 is a circuit diagram of another portion of the variable gain amplifier of FIG. 1.

A pair of selectively operable shunt-shunt feedback circuits 42a and 42b are coupled between the positive and negative high gain main output terminals 28 and 29, respectively, and the corresponding positive and negative main input terminals 4 and 5, respectively, for selectively varying the input impedance of the variable gain amplifier 1. The feedback circuit 42a comprises a variable gain feedback amplifier 43a, and the feedback circuit 42b comprises a variable gain feedback amplifier 43b. The feedback amplifiers 43a and 43b are identical to each other, and one of the feedback amplifiers 43 is illustrated in FIG. 3 and described in detail below. The feedback amplifiers 43a and 43b are operable under the control of the control circuit 10 as will also be described below in response to the selected gain stage 8, and the selected gain of the selected gain stage 8 when the selected gain stage 8 is in the first group 19 for effectively shunting variable impedance across the positive and negative main input terminals 4 and 5, for in turn maintaining the input impedance of the variable gain amplifier 1 within a predetermined input impedance range as the gain of the variable gain amplifier is varied.

Figure 4:
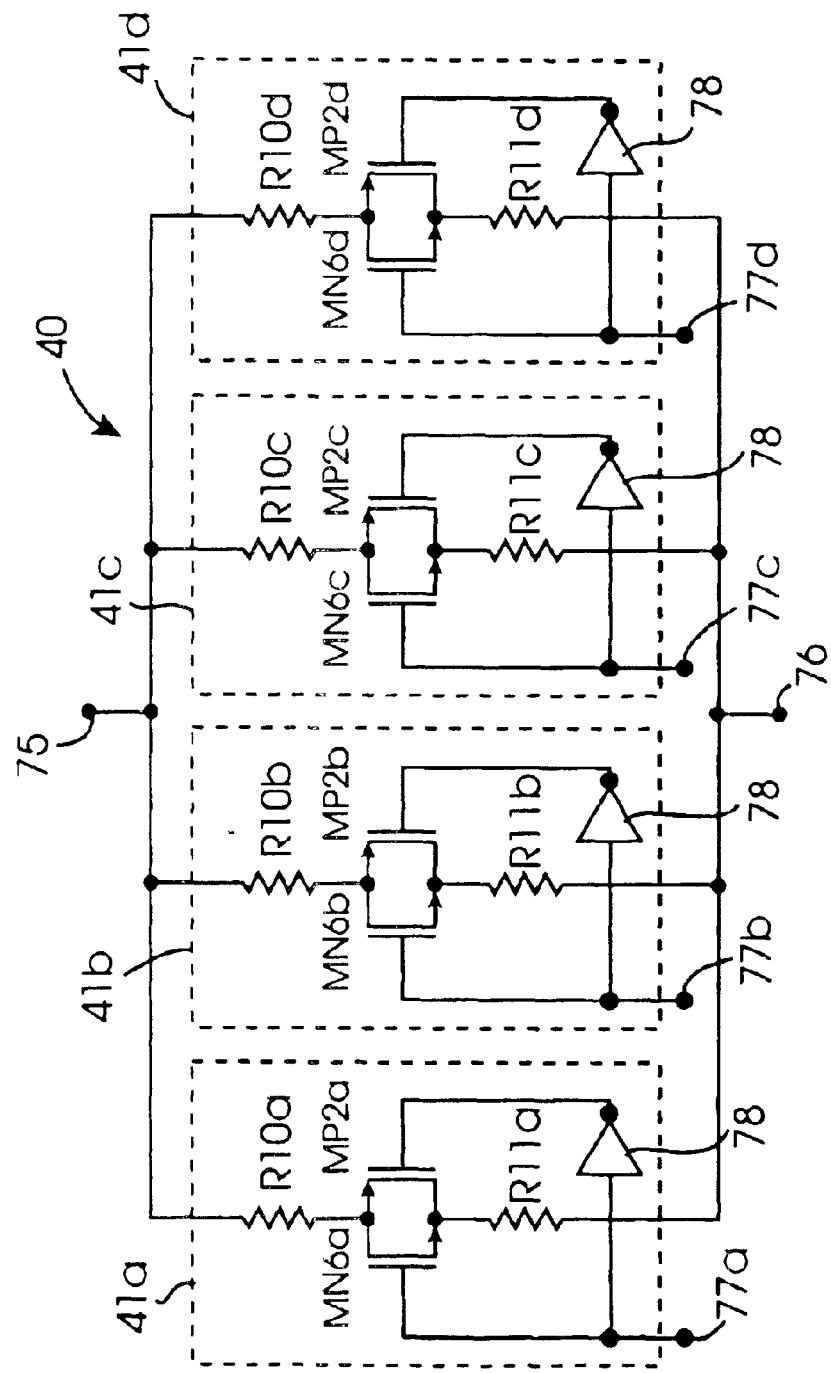
FIG. 4 is a circuit diagram of a further portion of the variable gain amplifier of FIG. 1.

A passive shunt impedance circuit 40 comprising a plurality of passive shunt impedance elements 41, see FIG. 4, are selectively switchable across the positive and negative main input terminals 4 and 5, also for varying the input impedance of the variable gain amplifier 1. The passive shunt impedance elements 41 are selectively shunted across the positive and negative main input terminals 4 and 5 under the control of the control circuit 10 in response to the selected gain stage 8, and the selected gain of the selected gain stage 8 for maintaining the input impedance of the variable gain amplifier 1 within the predetermined input impedance range, when the selected gain stage 8 is in the second group 20, and also when the selected gain stage 8 is in the first group 19 and the maximum impedance which can be provided by the feedback amplifiers 43a and 43b is insufficient for maintaining the input impedance of the variable gain amplifier 1 within the predetermined input impedance range.

Referring now to FIG. 2, one amplifier element 11 of a pair of the amplifier elements 11 of one of the gain stages 8 will now be described. The amplifier element 11 comprises a signal input 46 which is coupled directly to one of the signal inputs 12a or 12b of the corresponding gain stage 8, and a signal output 47 which is coupled directly to the corresponding one of the signal outputs 22a or 22b of the gain stage 8. A transconductance device MN1 for amplifying the input signal is coupled in series with a cascode device MN2 between the signal output 47 and ground. The cascode device MN2 is provided by a MOSFET, the drain of which is coupled to the signal output 47, and the source of which is coupled to the transconductance device MN1. The gate of the cascode device MN2 is selectively coupleable to a cascode bias voltage terminal 49 through a first switch S1, and to ground through a second switch S2. A cascode bias voltage, which is a fixed value DC voltage for biasing the cascade device on, and in turn for switching on and selecting the amplifier element 11, is applied to the cascode bias voltage terminal 49 by the control circuit 10. The switches S1 and S2, which are provided by MOS devices, are alternately operated under the control of the control circuit 10 by a select signal applied to a select terminal 50 for switching the gate of the cascode device MN2 to the cascode bias voltage terminal 49 or ground for selecting and deselecting, respectively, the amplifier element 11.

The select terminal 50 is coupled directly to the gate of the switch S1, and is coupled through an inverter 51 to the gate of the switch S2, so that when the select signal, namely, a logic high is applied to the select terminal 50 the switch S1 switches the gate of the cascode device MN2 to the cascode bias voltage terminal 49 and the switch S2 isolates the gate of the cascode device MN2 from ground, thereby selecting the amplifier element 11, and vice versa, when a deselect signal, namely, a logic low is applied to the select terminal 50 for deselecting the amplifier element 11.

The transconductance device MN1 is also provided by a MOSFET, the drain of which is coupled to the cascode device MN2, and the source of which is coupled to ground. The gate of the transconductance device MN1 is coupled to the signal input 46 as will be described below.

A current steering device MN3 couples the transconductance device MN1 to the supply voltage $V_{DD}$ of the variable gain amplifier 1 for varying the gain of the amplifier element 11. The current steering device MN3 is provided by a MOSFET, the drain of which is coupled to the supply voltage $V_{DD}$, and the source of which is coupled to the drain of the transconductance device MN1. The gate of the current steering device MN3 is selectively coupleable to a gain control terminal 52 of the amplifier element 11 and to ground through third and fourth switches S3 and S4, respectively. A variable DC bias voltage is applied to the gain control terminal 52 by the control circuit 10 for selecting the gain of the amplifier element 11 when the amplifier element 11 is selected. The third and fourth switches S3 and S4, which are provided by MOS devices, are alternately operable under the control of the control circuit 10 by the select and deselect signals applied to the select terminal 50 in the same way as the switches S1 and S2. Thus, when the amplifier element 11 is selected the gate of the current steering device MN3 is switched to the gain control terminal 52 by the third switch S3 and is isolated from ground by the fourth switch S4, and vice versa when the amplifier element is deselected.

First and second transconductance bias voltage terminals 54 and 55 are coupled to the gate of the transconductance device MN1 through fifth and sixth switches S5 and S6, and in turn through first and second impedance circuits, namely, first and second bias resistors R2 and R3, respectively, for selectively applying first and second bias voltages to the gate of the transconductance device MN1. The first and second bias voltages are fixed DC bias voltages and are applied to the first and second transconductance bias voltage terminals 54 and 55 by the control circuit 10. The first bias voltage is higher than the second bias voltage, and is of value for minimising the voltage dependency of the parasitic capacitance of the transconductance device MN1. The first bias voltage is applied to the gate of the transconductance device MN1 by the control circuit 10 when the amplifier element 11 is deselected, for a purpose which will be described below. The second bias voltage, which is applied to the second transconductance bias voltage terminal 55 by the control circuit 10 is of value for operating the transconductance device MN1 with its nominal bias current, and hence its nominal transconductance when the amplifier element 11 is selected. The fifth and sixth switches S5 and S6 are provided by MOS devices, and are operated under the control of the select signal on the select terminal 50 in similar fashion to the switches S1 and S2. Thus when the amplifier element 11 is selected the gate of the transconductance device MN1 is biased by the second bias voltage, and is biased by the first bias voltage when the amplifier element 11 is deselected. The impedance of the first and second bias resistors R2 and R3, through which the first and second bias voltages are applied to the transconductance device MN1, are selected to be significantly greater than the source impedance presented to the amplifier element 11 so that the influence of the first and second bias voltages on the frequency performance of the amplifier element 11 is substantially negligible.

As mentioned above, the first bias voltage is of value sufficient for minimising the voltage dependency of the parasitic capacitance of the transconductance device MN1. The parasitic capacitance of the transconductance devices MN1 of the amplifier elements 11 has an effect on the capacitance between the output taps 17 of the corresponding voltage divider impedance chain 14. Accordingly, by minimising the voltage dependency of the parasitic capacitance of the transconductance devices MN1 of the amplifier elements 11 which are deselected, the dependency of the attenuation characteristic of the voltage divider impedance chains 14 on whether a gain stage is selected or deselected is reduced. The reason for this is that the slight increase of the parasitic capacitance of an amplifier element 11 due to applying the first bias voltage partially compensates the increase of the effective input capacitance of an active amplifier element due to the Miller-effect.

Referring now to FIG. 3, one of the feedback amplifiers 43 will now be described. As mentioned above, both feedback amplifiers 43a and 43b are identical to each other. Each feedback amplifier 43 comprises an input terminal 60 which is coupled to the corresponding one of the high gain output lines 24 and 25 for in turn coupling the feedback amplifier 43 to the corresponding one of the high gain main output terminals 28 and 29. An output terminal 61 couples the feedback amplifier 43 to the corresponding one of the positive and negative main input terminals 4 and 5. A transconductance device MN4 of the feedback amplifier 43 is coupled to ground through a variable current sink device 63, and is selectively coupled to the supply voltage $V_{DD}$, of the variable gain amplifier 1 through a switching circuit 65 under the control of the control circuit 10 for selectively activating and deactivating the feedback amplifier 43. The transconductance device MN4 is provided by a MOSFET, the source of which is coupled to the variable current sink device 63, and the drain of which is connected to the switching circuit 65. The gate of the transconductance device MN4 is AC coupled to the input terminal 60 by a coupling capacitor C2, for isolating the gate of the transconductance device MN4 from the DC voltage on the input terminal 60, and in turn from the DC voltage on the corresponding one of the high gain output lines 24 and 25. The switching circuit 65 comprises CMOS switches MP1 and MN5 for selectively coupling the transconductance device MN4 to the supply voltage $V_{DD}$ and ground, respectively, for activating and deactivating the feedback amplifier 43, respectively.

A select terminal 66 applies a select signal from the control circuit 10 to the gates of the switch MN5 and to the gate of the switch MP1 for alternately switching the transconductance device MN4 to the supply voltage $V_{DD}$ or ground. A logic low on the select terminal 66 operates the switches MP1 and MN5 for coupling the transconductance device MN4 to the supply voltage $V_{DD}$ and isolating the transconductance device MN4 from ground, thus activating the feedback amplifier 43. A logic high on the select terminal 66 operates the switches MP1 and MN5 for isolating the transconductance device MN4 from the supply voltage $V_{DD}$ and for coupling the transconductance device MN4 to ground, and thus deactivating the feedback amplifier 43.

The variable current sink device 63 sets the bias current through the transconductance device MN4 for selecting the effective shunt impedance provided by the feedback amplifier 43 at the positive and negative main input terminals 4 and 5. A control terminal 68 receives a variable analogue control signal from the control circuit 10 for selecting the appropriate bias current to be sunk through the variable current sink device 63.

The output terminal 61 is coupled to the source of the transconductance device MN4 through a coupling resistor R8 for linearising the effect of the feedback amplifier 43 on the variable gain amplifier 1. The resistance value of the coupling resistor R8 is selected in conjunction with the transconductance of the transconductance device MN4, the voltage gain of the variable gain amplifier 1, the capacitance value of the capacitor C2 and the input parasitic capacitance of the transconductance device MN4, so that the effective shunt impedance R1 provided by the feedback amplifier 43 at the positive and negative main input terminals 4 and 5 is within a desired range for varying the input impedance of the variable gain amplifier 1. The effective shunt impedance $R_{in}$ provided by the feedback amplifier 43 for altering the input impedance of the variable gain amplifier 1 is given by the equation:

$$R_{in} = \frac{R_8 + \frac{1}{g_{m,Mn4}} \cdot \frac{C_2 + C_{in,Mn4}}{C_2}}{|G_v| + 1}$$

where $R_8$ is the resistance value of the coupling resistor R8, $C_2$ is the capacitance of the coupling capacitor C2, $G_v$ is the appropriate voltage gain of the variable amplifier 1, $C_{in,Mn4}$ is the effective input capacitance at the gate of the transconductance device MN4, and $g_{in,Mn4}$ is the transconductance of the transconductance device MN4.

Accordingly, where the transconductance of the transconductance device MN4 is very large compared with the value of the resistance of the coupling resistor R8, the input impedance $R_{in}$ is effectively determined by the resistance of the coupling resistor R8. Since the coupling resistor R8 is a passive device, it is linear, and thus, reduces the effect of the non-linearity of the transconductance of the transconductance device MN4. However, selecting the transconductance of the transconductance device MN4 to be relatively large does increase the power requirement of the feedback amplifier 43, and in turn the overall noise performance of the variable gain amplifier 1. Accordingly, the value of the resistor R8 in practice is chosen as a compromise between distortion performance, power consumption and noise performance. However, the main criterion, in general, on which the selection of the linearising coupling resistor R8 is based is the minimisation of distortion of the amplified input signal by the variable gain amplifier 1.

A feedback loop 70 from the output terminal 61 to the gate of the transconductance device MN4 is provided for maintaining the voltage on the output terminal 61 similar to the second bias voltage on the second transconductance bias voltage terminal 55 of the amplifier elements 11. This is required, since the output terminal 61 of the feedback amplifier 43 is connected to the corresponding one of the positive and negative main input terminals 4 and 5, and since the signal input 46 of the amplifier elements 11 of the first gain stage are connected to the corresponding ones of the positive and negative input terminals 4 and 5, it is essential that the bias voltage on the signal input 46 should be maintained around the same bias voltage as is applied to the second transconductance bias voltage terminal 55 of the two amplifier elements 11 of the first gain stage 8 when the respective amplifier elements 11 of the first gain stage 8 are selected.

The feedback loop 70 comprises an operational amplifier 71, the output of which is coupled through a coupling resistor R9 to the gate of the transconductance device MN4. The feedback loop 70 is coupled to the inverting input of the operational amplifier 71, and a bias voltage control terminal 72 is coupled to the non-inverting input of the operational amplifier 71. A DC bias voltage similar to the value of the second bias voltage which is applied to the second transconductance bias voltage terminal 55 of the amplifier elements 11 is applied to is the bias voltage control terminal 72 by the control circuit 10. The operational amplifier 71 drives the voltage on the gate of the transconductance device MN4 through the coupling resistor R9 until the voltage on the output terminal 61 is substantially equal to the bias voltage applied to the bias voltage control terminal 72. The operational amplifier 71 is selected to have a frequency response so that the operation of the feedback amplifier 43 is not affected in the frequency band within which the variable gain amplifier is to operate. The resistance value of the resistor R9 is chosen so that the time constant caused by the resistor R9 and the total capacitance at the gate of the transconductance device MN4 is large compared with the inverse of the minimum frequency of the frequency band within which the variable gain amplifier 1 is to operate.

By deactivating the feedback amplifier 43 by switching the drain of the transconductance device MN4 to ground has the advantage that the transconductance device MN4 remains turned off in the presence of high signal levels, which would otherwise increase signal distortion in the variable gain amplifier 1. Additionally, by switching the drain of the transconductance device MN4 to ground through the switching circuit 65 in order to deactivate the feedback amplifier 43, drain current flow is prevented even when the gate to source voltage of the transconductance device MN4 reaches the threshold voltage. Thus, additional distortion at very high input signal levels is avoided.

Referring now to FIG. 4, the passive shunt impedance circuit 40 will now be described. In this embodiment of the invention the passive shunt impedance circuit 40 comprises four shunt impedance elements 41a to 41d which are connected in parallel across respective terminals 75 and 76. The terminal 75 is coupled directly to the positive main input terminal 4, and the terminal 76 is coupled directly to the negative main input terminal 5. Each shunt impedance element 41 comprises a pair of identical resistors, namely, resistors R10 and R11. For convenience the resistors R10 and R11 of the shunt impedance element 41a are identified as resistors R10a and R11a, while the resistors of the shunt impedance element 41b are identified as resistors R10b and R11b, and so on to the shunt impedance element 41d, the resistors of which are identified as R10d and R10d. In this embodiment of the invention the resistors R10a to R10d and R11a to R11d are identical to each other. Each shunt impedance element 41 comprises a pair of CMOS switches, namely, an N type switch MN6 and a P type switch MP2 which are symmetrically coupled to the resistors R10 and R11 for selectively shunting the corresponding resistors R10 and R11 across the terminals 75 and 76. The gates of the switches MN6 and MP2 of each shunt impedance element 41 is coupled to a corresponding select terminal 77 for facilitating shunting of the shunt impedance elements 41 independently of each other across the terminals 75 and 76 and in turn across the positive and negative main input terminals 4 and 5 for varying the input impedance of the variable gain amplifier 1. The select terminal 77 of the shunt impedance element 41a is identified as the select terminal 77a, and so on up to the select terminal 77 of the shunt impedance element 41d, which is identified as the select terminal 77d. The select terminals 77 are independently connected to the control circuit 10 for receiving select signals for selecting the shunt impedance elements 41 independently of each other. The gate of the switch MN6 of each shunt impedance element 41 is coupled directly to the corresponding select terminal 77, while the gate of the switch MP2 is coupled through an inverter 78 to the select terminal 77. Accordingly, a logic high on each select terminal 77 operates the switches MN6 and MP2 for shunting the resistors R10 and R11 of that shunt impedance element 41 across the positive and negative main input terminals 4 and 5, while a logic low signal on the select terminal 77 of each shunt impedance element 41 decouples the shunt impedance element 41 from the positive and negative main input terminals 4 and 5.

Figure 5:
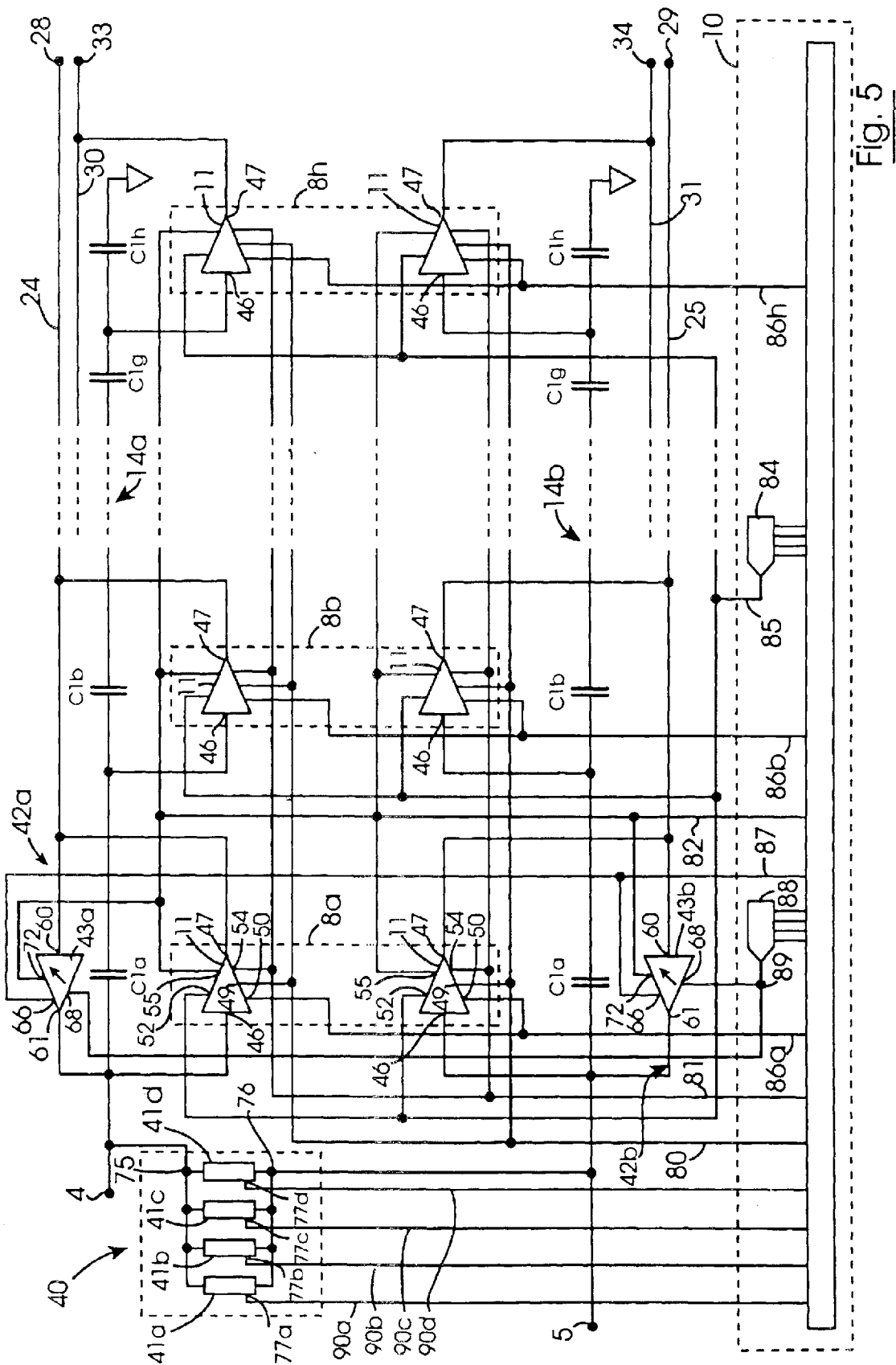
FIG. 5 is a circuit diagram of a portion of the variable gain amplifier of FIG. 1.

Referring now to FIG. 5, the relevant aspects of the control circuit 10 will now be described. The control circuit 10 comprises a plurality of fixed voltage sources for generating the fixed DC voltages for the amplifier elements 11 and the feedback amplifiers 43. The cascode bias voltage for applying to the cascode bias voltage terminals 49 of the amplifier elements 11 is supplied on a line 80 from the control circuit 10 to the cascode bias voltage terminals 49. The first transconductance fixed bias voltage is supplied by the control circuit 10 on a first bias voltage line 81 to the first transconductance bias voltage terminals 54 of the amplifier elements 11. The second fixed transconductance bias voltage is supplied by the control circuit 10 on a second bias voltage line 82 to the second transconductance bias voltage terminals 55 of the amplifier elements 11.

Select signals for selecting and activating the two amplifier elements 11 of the gain stage 8 to be selected are outputted on select lines 86a to 86h to the select terminals 50 of the appropriate pair of amplifier elements 11. The gain stage 8 to be selected is selected in response to the level of the input signal. Suitable signal analysing circuitry (not shown) which does not form part of the invention is provided for determining the appropriate level of gain required. Such signal analysing circuitry will be well known to those skilled in the art. A digital to analogue converter (DAC) 84 outputs the variable gain control voltage on a line 85 in response to an appropriate digital word generated by the control circuit 10, which is applied to the gain control terminals 52 of the amplifier elements 11 for setting the gain of the two amplifier elements 11 of the selected gain stage 8. Since only one gain stage 8 is selected at any one time, the gain control voltage is applied to all the amplifier elements 11 simultaneously without affecting the operation of the variable gain amplifier 1. The digital word for selecting the voltage output of the DAC 84 is derived by the control circuit 10 in response to the level of the input signal determined by the signal analysing circuitry (not shown).

The bias voltage for applying to the bias voltage control terminals 72 of the operational amplifiers 71 of the respective feedback amplifiers 43 is similar to the second bias voltage applied to the second transconductance bias voltage terminals 55 of the amplifier elements 11, and is supplied to the bias voltage control terminals 72 on the second bias voltage line 82. Select signals for simultaneously activating the feedback amplifiers 43 are applied to the select terminals 66 of the feedback amplifiers 43 on select lines 87. A DAC 88 in response to an appropriate digital word provided by the control circuit 10 outputs the variable analogue signal on a line 89 to the control terminals 68 of the feedback amplifiers 43 for setting the variable current sink devices 63, for in turn setting the appropriate bias current through the transconductance devices MN4 of the feedback amplifiers 43, so that the effective shunt impedance provided by the feedback amplifiers 43 at the positive and negative main input terminals 4 and 5 is of the appropriate value.

Four select lines 90a, 90b, 90c and 90d from the control circuit 10 apply select signals to the select terminals 77a, 77b, 77c and 77d, respectively, of the shunt impedance circuit 40 for selecting the corresponding one of the shunt impedance elements 41.

As the gain of the variable gain amplifier 1 is reduced by sequentially selecting the gain stages from the gain stage 8a to the gain stage 8h, and as the gains of the selected gain stages are also reduced, the input impedance of the variable gain amplifier increases. The input impedance for each value of gain is known and accordingly, the amount of shunt impedance required across the positive and negative main input terminals 4 and 5 in order to maintain the input impedance of the variable gain amplifier 1 within the predetermined input impedance range for impedance matching with the source impedance from which the input signal is being derived is also known. A look-up table is stored in the control circuit 10 which cross-references appropriate settings for the feedback amplifiers and/or the appropriate number of shunt impedance elements 41 of the passive shunt impedance circuit to be shunted across the positive and negative main input terminals 4 and 5 with corresponding gain settings for the variable gain amplifier 1. Thus, on the gain of the variable gain amplifier being selected, the settings for the feedback amplifier and/or the appropriate number of shunt impedance elements 41 of the passive shunt impedance circuit 40 are looked up in the look-up table, and the control circuit 10 then selects the feedback amplifiers 43 and sets the variable current sink device 63 to sink the appropriate bias current through the transconductance device MN4 of the feedback amplifier, and/or selects the appropriate number of shunt impedance elements 41 in the passive shunt impedance circuit 40 for maintaining the input impedance of the variable gain amplifier 1 within the predetermined input impedance range.

The variable gain amplifier 1 is implemented in CMOS, and while the amplifier elements 11 have been described as being identical to each other, the feedback amplifiers have been described as being identical to each other, the shunt impedance elements have been described as being identical to each other, and the capacitors C1a to C1g of the voltage divider impedance chains 14a and 14b have been described as being identical to each other, all these components are identical to each other within the limits of CMOS processes.

In use, a differential broadband radio frequency signal, for example, a cable or terrestrial digital television signal to be amplified is applied to the variable gain amplifier 1 with the positive end of the input signal applied to the positive main input terminal 4, and the negative end of the input signal applied to the negative main input terminal 5. The gain of the variable gain amplifier 1 is set by the control circuit 10 at the desired level of gain by selecting the appropriate one of the gain stages 8a to 8h, and setting the gain of the two amplifier elements 11 of the selected gain stage 8 to the desired gain level. The appropriate gain stage 8 is selected by the control circuit 10 outputting a select signal on the appropriate one of the select lines 86a to 86h to the select terminals 50 of the amplifier elements 11 of the gain stage 8 to be selected. The gain of the amplifier elements 11 of the selected gain stage 8a to 8h is set by the control circuit 10 outputting a digital word of the appropriate value to the DAC B4 for setting the gain control voltage on the gain control terminal 52 of the amplifier elements 11 at the desired level, for in turn, setting the gain of the amplifier elements 11 to the desired gain. The control circuit 10 then selects and sets the feedback amplifiers 43 and/or the passive shunt impedance circuit 40 for providing the appropriate shunt impedance at the positive and negative main input terminals 4 and 5 corresponding to the selected gain of the variable gain amplifier 1, for in turn maintaining the input impedance of the variable gain amplifier 1 within the predetermined input impedance range, In this embodiment of the invention, the feedback amplifiers 43 are only selected when the gain stage 8a in the first group 19 is selected. The passive shunt impedance circuit 40 is selected when one of the gain stages 8b to 8d of the first group 19 and when one of the gain stages 8e to 8h of the second group 20 is selected. The passive shunt impedance circuit 40 may also be selected if the shunt impedance provided by the feedback amplifiers 43 is insufficient for maintaining the input impedance of the variable gain amplifier 1 within the predetermined input impedance range when the first gain stage 8a of the first group 19 is selected. In certain variable gain amplifiers according to the invention, the feedback amplifiers 43 may be able to provide sufficient shunt impedance for maintaining the input impedance of the variable gain amplifier 1 within the predetermined input impedance range, when either the second or third gain stages 8b or 8c are selected, in which case, the passive shunt impedance circuit 40 would not be selected until the shunt impedance provided by the feedback amplifiers 43 was unable to maintain the input impedance of the variable gain amplifier 1 within the predetermined input impedance range. Additionally, in some variable gain amplifiers according to the invention, a combination of the passive shunt impedance circuit 40 and the feedback amplifiers 43 may be selected when the gain stages 8a to 8d of the first group 19 are selected, and in particular, when the second, third and fourth gain stages 8b, 8c and 8d are selected, if the feedback amplifiers 43 are unable to provide sufficient shunt impedance for maintaining the input impedance of the variable gain amplifier 1 within the predetermined input impedance range.

Figure 6:
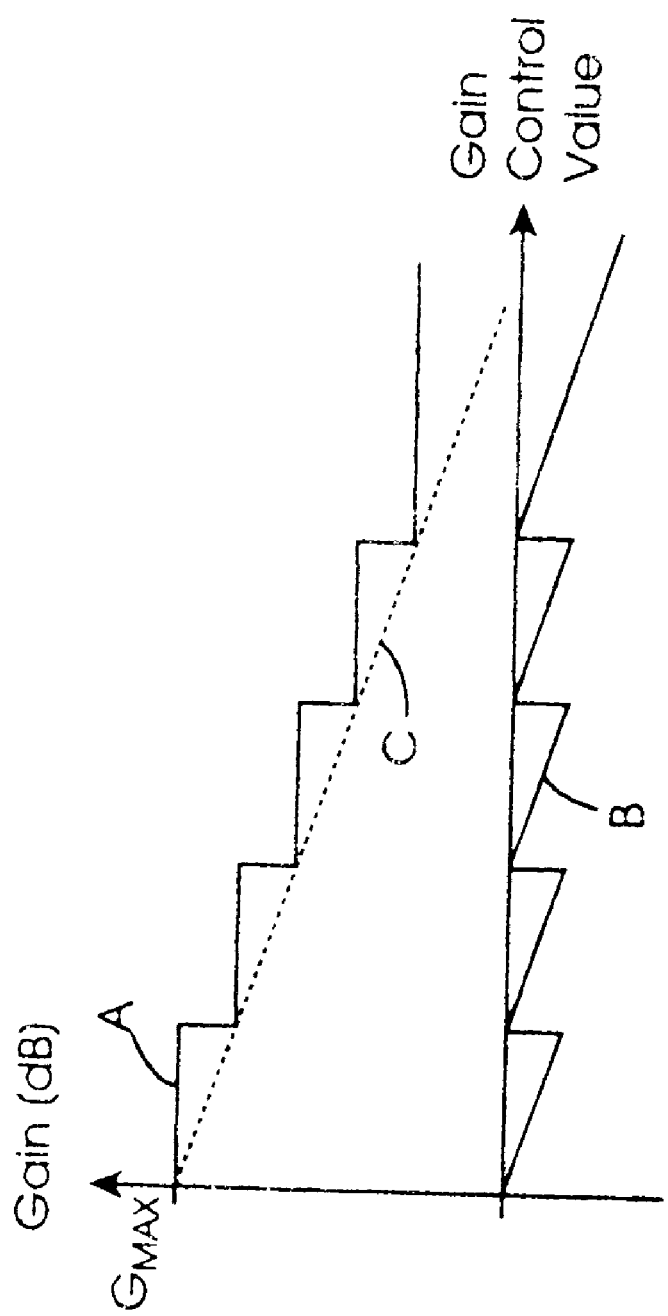
FIG. 6 illustrates waveforms of how the gain of the amplifier of FIG. 1 may be varied, and how the gain of individual stages of the amplifier of FIG. 1 may be varied.

Referring now to FIG. 6, the linearity on a logarithmic scale of the variability of the gain of the variable gain amplifier 1 is illustrated. The waveform A illustrates the step reduction of the gain of the variable gain amplifier 1 from gain stage 8 to gain stage 8, when the respective gain stages 8 are operating at their maximum gain. The maximum gain is obtained from the first gain stage 8a when it is operating at its maximum gain, and the minimum gain is obtained from the eighth gain stage 8h. The waveform A illustrates the gain of each gain stage 8 when operating at its maximum gain. The waveform B illustrates the sawtooth attenuation of the gain of each of the gain stages 8a to 8h when the gain stages are operating independently of the circuit, and the gains of the respective gain stages 8a to 8h are attenuated from their maximum gain to their minimum gain. The waveform C illustrates the variability of the gain of the variable gain amplifier 1 when the gain stages 8 are progressively sequentially selected from the first gain stage to the eighth gain stage, and as each gain stage is selected its gain is reduced from its maximum gain value to its minimum gain value before selecting the next sequential gain stage.

While the variable gain amplifier has been described as being a differential variable gain amplifier, the variable gain amplifier could be provided in non-differential form. In which case, each gain stage would be provided with a single amplifier element, and only one voltage divider impedance chain would be provided through which the input signal to be amplified would be applied to the respective gain stages through the corresponding output taps of the voltage divider impedance chain. Additionally, only one shunt-shunt feedback circuit would be provided.

It will also be appreciated that while the variable gain amplifier has been described as comprising eight stages, the variable gain amplifier may be provided with any number of gain stages, and furthermore, it is envisaged that the gain stages may be arranged in any number of groups, and in certain cases, it is envisaged that the gain stages may be arranged in one single group only. However, when the gain stages are arranged in a plurality of groups, the number of gain stages in each group may be the same or different. It is also envisaged that where the variable gain amplifier is provided with the gain stages arranged in a plurality of groups, more shunt-shunt feedback circuits may be provided from more than one of the groups of gain stages. Indeed, in certain cases, shunt-shunt feedback circuits may be provided from each group of gain stages.

While the shunt-shunt feedback circuits have been described as being coupled between the positive and negative high gain main output terminals 28 and 29 and the positive and negative main input terminals 4 and 5, in certain cases, it is envisaged that the shunt-shunt feedback circuits may be arranged to feedback the amplified input signal from a single gain stage to the main input terminals, and this could be done independently of the signal on the main output terminals. For example, the gain stages may be provided with auxiliary outputs which would be independent of the signal outputs of the gain stages which are coupled to the main output terminals, and the amplified input signal would be fed back to the corresponding main input terminal from the corresponding auxiliary outputs. In which case, the shunt-shunt feedback circuits would be coupled between the respective auxiliary outputs of one of the gain stages, for example, the first gain stage and the corresponding main input terminals. The signal outputs of the gain stages would be coupled to the main output terminals. Needless to say in the case of a non-differential amplifier, a single shunt-shunt feedback circuit would be provided, which could be coupled between an auxiliary output of a gain stage, for example, the first gain stage and the main input terminal. It is also envisaged that a plurality of shunt-shunt feedback circuits may be provided between the auxiliary outputs of a plurality of corresponding gain stages and the corresponding main input terminal or terminals, as the case may be, and it is also envisaged that where the gain stages are arranged in M groups, more than one shunt-shunt feedback circuit may be provided between the main inputs of some or all of the M groups of gain stages and the main input terminal or terminals as the case may be.

While the capacitors of the voltage divider impedance chain have been described as being similar to each other, in order to provide a linear variation in the attenuation from output tap to output tap on a logarithmic scale, it will be readily apparent to those skilled in the art that the value of the capacitors between adjacent pairs of output taps may be different from one pair of adjacent output taps to the next pair of adjacent output taps, to provide an alternative attenuation regime from the voltage divider impedance chains.

While the passive shunt impedance circuit has been described as comprising four shunt impedance elements, the passive shunt impedance circuit may comprise any number of shunt impedance elements from one upwards, and the shunt impedance elements may be the same or different.

It will also be appreciated that where each group of gain stages is provided with a shunt-shunt feedback circuit, the shunt-shunt feedback circuits may be the same or different, but typically, will be different to each other.

While the gain stages of the variable gain amplifier have been described as being identical to each other, in certain cases, it is envisaged that the gain stages may not be identical to each other. However, for symmetry where the variable gain amplifier is provided as a differential variable gain amplifier, in general, it is envisaged that the amplifier elements of each gain stage will be similar to each other, although the amplifier elements may be different from gain stage to gain stage.

While the shunt-shunt feedback circuit has been described as comprising feedback amplifiers of variable gain, and thus variable impedance, it is envisaged, in certain cases, that the feedback amplifier may not be of variable gain.

While the amplifier elements of the gain stages have been described as being of variable gain, it is envisaged in certain cases that the gain of the amplifier elements may not be variable.

While the variable gain amplifier has been described for amplifying television signals, it will be readily apparent to those skilled in the art that the variable gain amplifier according to the invention may be used for amplifying any other signals of any other frequencies.

Additionally, while the variable gain amplifier has been described as being implemented by a CMOS process, and indeed, the variable gain amplifier according to the invention is ideally suited for implementing in a CMOS process, it is envisaged that the variable gain amplifier according to the invention may be implemented by other suitable processes besides CMOS.

What is claimed is:

1. A variable gain amplifier comprising:
   a main input terminal for receiving an input signal to be amplified,
   a main output terminal for outputting the amplified signal,
   N selectively selectable gain stages, where N is an integer greater than one, for amplifying the input signal, the gain stages having respective signal outputs for providing the amplified input signal to the main output terminal, a first of the N gain stages being coupled to the main input terminal,
   a voltage divider impedance chain, a first end of which is coupled to the main input terminal, the voltage divider impedance chain having (N-1) output taps coupled to respective ones of the gain stages from a second one to an Nth one of the N gain stages for applying the input signal to the gain stages from the second to Nth gain stage progressively attenuated from the second gain stage to the Nth gain stage,
   a selectively operable shunt-shunt feedback circuit for feeding back the amplified input signal from at least one of the gain stages to the main input terminal for varying the input impedance of the variable gain amplifier,
   at least one passive shunt impedance element selectively switchable to the main input terminal for varying the input impedance of the variable gain amplifier, and
   a control circuit for selecting the feedback circuit and the at least one passive shunt impedance element in response to the selected gain stage for maintaining the input impedance of the variable gain amplifier within a predetermined input impedance range.

2. A variable gain amplifier as claimed in claim 1 in which the feedback circuit is arranged for feeding back the amplified input signal from the first one of the N gain stages to the main input terminal.

3. A variable gain amplifier as claimed in claim 1 in which the feedback circuit feeds back the amplified input signal to the main input terminal independently of the signal on the main output terminal.

4. A variable gain amplifier as claimed in claim 1 in which the signal outputs of the gain stages are coupled to the main output terminal, and the feedback circuit is operably coupled between the main output terminal and the main input terminal.

5. A variable gain amplifier as claimed in claim 1 in which the feedback circuit and the at least one passive shunt impedance element are alternately selectable by the control circuit.

6. A variable gain amplifier as claimed in claim 1 in which the feedback circuit and the at least one passive shunt impedance element are simultaneously selectable by the control circuit.

7. A variable gain amplifier as claimed in claim 1 in which the at least one passive shunt impedance element is selected by the control circuit when the shunt impedance value applied to the main input terminal by the feedback circuit is insufficient for maintaining the input impedance of the variable gain amplifier within the predetermined input impedance range.

8. A variable gain amplifier as claimed in claim 1 in which a plurality of passive shunt impedance elements are provided, the passive shunt impedance elements being selectively selectable by the control circuit in response to the selected gain stage.

9. A variable gain amplifier as claimed in claim 1 in which the impedance values of the respective passive shunt impedance elements are the same or different.

10. A variable gain amplifier as claimed in claim 1 in which each passive shunt impedance element comprises a passive resistive element.

11. A variable gain amplifier as claimed in claim 1 in which the shunt impedance value applied to the main input terminal by the feedback circuit is selectively variable under the control of the control circuit in response to the selected gain stage.

12. A variable gain amplifier as claimed in claim 1 in which the feedback circuit comprises an input terminal coupled to the main output terminal, an output terminal coupled to the main input terminal, and a transconductance device for feeding a bias current to the main input terminal through the output terminal.

13. A variable gain amplifier as claimed in claim 12 in which the bias current of the transconductance device of the feedback circuit is variable under the control of the control circuit in response to the selected gain stage.

14. A variable gain amplifier as claimed in claim 13 in which the feedback circuit comprises a control terminal for receiving a control signal from the control circuit for setting the bias current of the transconductance device.

15. A variable gain amplifier as claimed in claim 14 in which the value of the control signal for controlling the bias current of the transconductance device is selectable by the control circuit in response to the selected gain stage.

16. A variable gain amplifier as claimed in claim 12 in which the output of the feedback is circuit is fed back to the inverting input of an operational amplifier, a control voltage being applied to the non-inverting input of the operational amplifier, and an output of the operational amplifier is coupled to the transconductance device for controlling the bias voltage of the transconductance device so that the output voltage on the output terminal of the feedback circuit is driven to the value of the control voltage applied to the non-inverting input of the operational amplifier.

17. A variable gain amplifier as claimed in claim 12 in which the input terminal to the feedback circuit is AC coupled to the main output terminal.

18. A variable gain amplifier as claimed in claim 1 in which each gain stage comprises an amplifier element comprising a transconductance device to which the input signal is amplified.

19. A variable gain amplifier as claimed in claim 18 in which the gain of the amplifier element of at least some of the gain stages is variable under the control of the control circuit.

20. A variable gain amplifier as claimed in claim 19 in which the feedback circuit and the at least one passive shunt impedance element are selected by the control circuit in response to the selected gain of the amplifier element of the selected gain stage.

21. A variable gain amplifier as claimed in claim 20 in which the value of the control signal for controlling the bias current of the transconductance device of the feedback circuit is selected in response to the selected gain of the amplifier element of the selected gain stage.

22. A variable gain amplifier as claimed in claim 18 in which the voltage divider impedance chain is a capacitive voltage divider comprising a plurality of capacitive elements defining the output taps therebetween.

23. A variable gain amplifier as claimed in claim 22 in which the capacitance of the capacitive elements between the output taps of the voltage divider impedance chain are selected to take account of the parasitic capacitance of the transconductance devices of the respective amplifier elements of the gain stages for determining the attenuation of the input signal at the respective output taps.

24. A variable gain amplifier as claimed in claim 23 in which the capacitance of the capacitive elements of the voltage divider impedance chain are selected to take account of the parasitic capacitance of the transconductance devices of the respective amplifier elements of the gain stages when the transconductance devices thereof are biased with a voltage of value such that the voltage dependency of the parasitic capacitance of the transconductance devices is minimised.

25. A variable gain amplifier as claimed in claim 22 in which the capacitance of the capacitive elements of the voltage divider impedance chain are selected for linearising the attenuation on a logarithmic scale of the input signal presented sequentially on the output taps from the first output tap to the (N-1) output tap.

26. A variable gain amplifier as claimed in claim 1 in which the impedance value between each pair of adjacent output taps of the voltage divider impedance chain is selected so that the attenuating effect of the voltage divider impedance chain between each pair of adjacent output taps does not exceed the range over which the gain of the preceding gain stage may be varied.

27. A variable gain amplifier as claimed in claim 26 in which the impedance value between each pair of adjacent output taps of the voltage divider impedance chain is selected so that the attenuating effect of the voltage divider impedance chain between each pair of adjacent output taps is substantially similar to the range over which the gain of the preceding gain stage may be varied.

28. A variable gain amplifier as claimed in claim 1 in which a second end of the voltage divider impedance chain is coupled to a reference ground.

29. A variable gain amplifier as claimed in claim 18 in which each amplifier element comprises a first bias voltage terminal for receiving a first bias voltage for applying to the transconductance device thereof for minimising the voltage dependency of the parasitic capacitance of the transconductance device when the gain stage comprising that amplifier element is not selected.

30. A variable gain amplifier as claimed in claim 29 in which the first bias voltage terminal is selectively switchable to the transconductance device under the control of the control circuit.

31. A variable gain amplifier as claimed in claim 29 in which the first bias voltage terminal of each amplifier element is coupled to the transconductance device thereof through a first impedance circuit.

32. A variable gain amplifier as claimed in claim 31 in which the impedance of the first impedance circuit of each amplifier element is greater than the source impedance presented to the amplifier element so that the influence of the first bias voltage on the frequency characteristic of the voltage divider impedance chain remains substantially negligible when the gain stage comprising that amplifier element is not selected.

33. A variable gain amplifier as claimed in claim 18 in which each amplifier element comprises a second bias voltage terminal for receiving and applying a second bias voltage to the transconductance device thereof for biasing the transconductance device of the amplifier element when the gain stage comprising the amplifier element is selected.

34. A variable gain amplifier as claimed in claim 33 in which the second bias voltage terminal of each amplifier element is selectively switchable to the transconductance device thereof under the control of the control circuit.

35. A variable gain amplifier as claimed in claim 33 in which the second bias voltage terminal of each amplifier element is coupled to the transconductance device thereof through a second impedance circuit, the impedance of the second impedance circuit being greater than the source impedance presented to the amplifier element so that the influence of the second bias voltage on the frequency characteristic of each amplifier element remains substantially negligible when the gain stage comprising that amplifier element is selected.

36. A variable gain amplifier as claimed in claim 1 in which the gain stages are the same or different.

37. A variable gain amplifier as claimed in claim 1 in which only one gain stage is selectable at one time.

38. A variable gain amplifier as claimed in claim 1 in which the N gain stages are arranged in M groups, where M is an integer from 2 upwards, and M main output terminals are provided, the outputs of the gain stages of the respective groups being coupled to corresponding ones of the M main output terminals, with the outputs of the gain stages of a first group of the groups of gain stages being coupled to a first one of the M main output terminals, and the outputs of the gain stages of an Mth group of the M groups of gain stages being coupled to an Mth one of the M main output terminals.

39. A variable gain amplifier as claimed in claim 38 in which the feedback circuit is operably coupled between the main input terminal and one of the M main output terminals.

40. A variable gain amplifier as claimed in claim 38 in which the first group of the M groups of gain stages provides the greatest gain.

41. A variable gain amplifier as claimed in claim 38 in which the feedback circuit is coupled to the first main output terminal of the M main output terminals.

42. A variable gain amplifier as claimed in claim 38 in which a plurality of feedback circuits are provided corresponding to respective ones of at least some of the M main output terminals for feeding back the output signals on the corresponding ones of the at least some of the M main output terminals to the main input terminal.

43. A variable gain amplifier as claimed in claim 1 in which a shunt peak output load element is coupled to each main output terminal for enhancing the bandwidth of the variable gain amplifier and minimising power consumption.

44. A variable gain amplifier as claimed in claim 18 in which the variable gain amplifier is a differential variable gain amplifier comprising a pair of main input terminals for receiving respective positive and negative ends of a differential input signal, a pair of main output terminals for outputting respective positive and negative ends of the amplified differential output signal, each gain stage comprising a pair of amplifier elements for amplifying the corresponding ones of the positive and negative ends of the differential input signal, and for outputting the amplified positive and negative signals on the respective corresponding main output terminals, and a pair of voltage divider impedance chains coupled to the respective main input terminals for applying the positive and negative ends of the differential input signal to the corresponding amplifier elements of the second to the Nth gain stage.

45. A variable gain amplifier comprising:
- a main input terminal for receiving an input signal to be amplified,
- a main output terminal for outputting the amplified signal,
- N selectively selectable gain stages, where N is an integer greater than one, each gain stage comprising:
- an amplifier element comprising a transconductance device for amplifying the input signal, a signal output for providing the amplified signal to the main output terminal, and a signal input, the signal input of the amplifier element of a first of the N gain stages being coupled to the main input terminal,
- a first bias voltage terminal being provided to each amplifier element for receiving a first bias voltage for applying to the transconductance device, the first bias voltage being of value for minimising the voltage dependency of the parasitic capacitance of the transconductance device when the corresponding gain stage is not selected,
- a voltage divider impedance chain, a first end of which is coupled to the main input terminal, the voltage divider impedance chain having (N-1) output taps coupled to the signal inputs of the amplifier elements of the respective ones of the gain stages from a second one to an Nth one of the N gain stages for applying the input signal to the amplifier elements of the gain stages from the second to the Nth gain stage progressively attenuated from the second gain stage to the Nth gain stage.

46. A variable gain amplifier comprising:
- a main input terminal for receiving an input signal to be amplified,
- a main output terminal for outputting the amplified signal,
- an amplifier element of selectable gain having a signal input for receiving an input signal from the main input terminal, and a signal output for providing the amplified input signal to the main output terminal,
- a selectively operable shunt-shunt feedback circuit for feeding back the amplified input signal from the amplifier element to the main input terminal for varying the input impedance of the variable gain amplifier,
- at least one passive shunt impedance element selectively switchable to the main input terminal for varying the input impedance of the variable gain amplifier, and
- a control circuit for selecting the feedback circuit and the at least one passive shunt impedance element in response to the selected gain of the amplifier element for maintaining the input impedance of the variable gain amplifier within a predetermined input impedance range.

* * * * *